United States Patent
He et al.

(10) Patent No.: US 7,371,960 B2
(45) Date of Paternt: May 13, 2008

(54) FIGURE OF MERIT IN YTTERBIUM-ALUMINUM-MANGANESE INTERMETALLIC THERMOELECTRIC AND METHOD OF PREPARATION

(75) Inventors: Tao He, Wilmington, DE (US); James J. Krajewski, Somerville, NJ (US); Munirpallam Appadorai Subramanian, Kennett Square, PA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 135 days.

(21) Appl. No.: 10/911,006

(22) Filed: Aug. 4, 2004

(65) Prior Publication Data

US 2005/0121066 A1 Jun. 9, 2005

Related U.S. Application Data

(60) Provisional application No. 60/527,729, filed on Dec. 8, 2003.

(51) Int. Cl.
*H01L 35/12* (2006.01)

(52) U.S. Cl. .................. 136/236.1; 136/203; 136/205

(58) Field of Classification Search .............. 136/236.1, 136/201, 242, 203, 205; 257/467; 419/26, 419/30, 1; 423/21.1
See application file for complete search history.

(56) References Cited

U.S. PATENT DOCUMENTS

| | | |
|---|---|---|
| 5,064,476 A | 11/1991 | Recine |
| 5,171,372 A | 12/1992 | Recine |
| 5,441,576 A | 8/1995 | Bierschenk |
| 5,576,512 A | 11/1996 | Doke |
| 5,610,366 A | 3/1997 | Fleurial |
| 5,747,728 A | 5/1998 | Fleurial |
| 5,769,943 A | 6/1998 | Fleurial |
| 5,929,351 A | 7/1999 | Kusakabe |
| 5,965,841 A | 10/1999 | Imanishi |
| 6,188,011 B1 | 2/2001 | Nolas |
| 6,207,886 B1 * | 3/2001 | Kusakabe et al. .......... 136/201 |
| 6,207,888 B1 | 3/2001 | Nolas |
| 6,225,550 B1 | 5/2001 | Hornbostel et al. |
| 6,235,981 B1 | 5/2001 | Miyoshi |
| 6,342,668 B1 | 1/2002 | Fleurial |
| 6,369,314 B1 | 4/2002 | Nolas |
| 2003/0168641 A1 | 9/2003 | Funahashi et al. |
| 2005/0123431 A1 | 6/2005 | He |
| 2005/0229983 A1 | 10/2005 | He |

FOREIGN PATENT DOCUMENTS

| | | | |
|---|---|---|---|
| JP | 57179023 A | | 4/1982 |
| JP | 57-179023 A | * | 11/1982 |
| JP | 4-62981 A | * | 2/1992 |
| JP | 08057290 A | | 5/1996 |
| JP | 2001102642 A | | 4/2001 |
| JP | 2002026400 A | | 1/2002 |
| WO | WO 2005/056847 A1 | * | 6/2005 |

OTHER PUBLICATIONS

Rowe et al, "Thermoelectric properties of hot-pressed YbAl3 compound over temperature range 150-800 K," 18th International Conference on Thermoelectrics, IEEE (1997) pp. 528-531.*
He et al, "Origin of low thermal conductivity in α-Mn: Enhancing the ZT of YbAl3 and CoSb3 through Mn addition," 2005 International Conference on Thermoelectrics, IEEE, (2005), pp. 437-442.*
Brian C. Sales, Novel Thermoelectric Materials, Current Opinion on Solid State and Materials Science, 1997, pp. 284-289, vol. 2.
Y.K. Kuo et. al., Thermoelectric Properties of Binary CD-YB Quasicrystals and CD6YB, Journal of Applied Physics, 2004, pp. 1900-1905, vol. 95.
Akai et. al., Effects of Defects and Impurities on Electronic Properties in Skuteruditers, 17th International Conference on Thermoelectrics, 1998, pp. 105-108.
B.C. Sales et. al., Filled Skutterudite Antimonides: A New Class of Thermoelectric Materials, Science, 1996, pp. 1325-1328, vol. 272.
Lidong Chen, Recent Advances in Filled Skutterudite Systems, 21st International Conference on Thermoelectronics, 2002, pp. 42-47.
Ctirad Uher, In Search of Efficient N-Type Skutterudite Thermoelectrics, 21st International Conference on Thermoelectronics, 2002, pp. 35-41.
Jeffrey S. Dyck et. al., Thermoelectric Properties of the N-Type Filled Skutterudite Ba 0.3 Co4 Sb12 Doped With Ni, Journal of Applied Physics, 2002, pp. 3698-3705, vol. 91.
Koji Akai et. al., Effects of Defects and Impurities on Electronic Properties in CoSB3, 16th International Conference on Thermoelectrics, 1997, pp. 334-337.

* cited by examiner

*Primary Examiner*—Nam Nguyen
*Assistant Examiner*—Thanh-Truc Trinh

(57) ABSTRACT

This invention provides novel thermoelectric compounds comprising:
  a) atomic percent Ytterbium
  b) between 50 and 74.999 atomic percent Aluminum
  c) between 0.001 and 25 atomic percent Manganese and a process for their preparation.

5 Claims, No Drawings

FIGURE OF MERIT IN YTTERBIUM-ALUMINUM-MANGANESE INTERMETALLIC THERMOELECTRIC AND METHOD OF PREPARATION

CROSS REFERENCE TO RELATED APPLICATIONS

This application claims the benefit of U.S. Provisional Appl. No. 60/527,729, filed Dec. 8, 2003.

FIELD OF THE INVENTION

This invention relates to novel thermoelectric compositions of the formula $YbAl_{3-x} Mn_x$ (0<x<1), with a figure of merit greater than 0.2.

TECHNICAL BACKGROUND OF THE INVENTION

Thermoelectric or Peltier refrigerators produce only a moderate amount of cooling but have poor efficiencies when compared to compressor based refrigerators. The thermoelectric energy conversion efficiency is measured in terms of the dimensionless "figure of merit, ZT". To maximize ZT, materials with large Seebeck coefficient, high electrical conductivity, but with low thermal conductivity are needed. The known intermetallic compound $YbAl_3$ has a relatively high Seebeck coefficient and high electrical conductivity but its thermal conductivity is too high e.g. 12 W/µK. Usually intermetallic materials are poor thermoelectric materials but this compound exhibits unusual transport properties leading to a large Seebeck coefficient. Adding materials with very low thermal conductivity lowers the ZT, if the addition does not degrade the other inter-related parameters.

SUMMARY OF THE INVENTION

The present invention is a compound comprising:
a) 25 atomic percent Ytterbium
b) between 50 and 74.999 atomic percent Aluminum
c) between 0.001 and 25 atomic percent Manganese The present invention also includes a thermoelectric refrigerator comprising a component made from the compound of this invention.

The present invention is further a thermoelectric generator comprising a component made from the compound of this invention.

Another embodiment of the present invention is a thermoelectric heater comprising a component made from the compound of this invention.

A yet further embodiment of the present invention is a process comprising
a) mixing powders to form a mixture with the composition
  i) 25 atomic percent Ytterbium
  ii) between 50 and 74.999 atomic percent Aluminum
  iii) between 0.001 and 25 atomic percent Manganese
b) pressing said mixture to form a pressed mixture
c) firing said pressed mixture at 800° C. for 12 hours in a vacuum furnace to form a calcined powder comprising a compound having the composition i) 25 atomic percent Ytterbium; ii) between 50 and 74.999 atomic percent Aluminum; and iii) between 0.001 and 25 atomic percent Manganese
d) grinding said calcined powder to form a ground powder
e) pressing said ground powder.

DETAILED DESCRIPTION

This invention provides novel intermetallic thermoelectric compositions of the formula $YbAl_{3-x} Mn_x$ (0<x<1). When compared to $YbAl_3$ (x=0), these compounds have a higher electrical resistivity, lower thermal conductivity, but similar Seebeck coefficient values in the temperature range 150° K-300° K. This results in an improvement in the figure of merit from 0.18 (x=0) to 0.60 (x=0.04).

The thermoelectric compositions of this invention, $YbAl_{3-x} Mn_x$ (0<x<1), have thermoelectric properties that decreases the thermal conductivity significantly and electrical conductivity without affecting the Seebeck coefficient. This combination results in a significant improvement in ZT.

The compositions of this invention have been synthesized by the following procedure. Stoichiometric amounts of the starting materials were weighed and thoroughly mixed. The starting materials were −40 mesh size ytterbium metal, aluminum metal and manganese metal with 99.99% purity. The mixed powder of starting materials was pressed into a 1" diameter disks. They were loaded into a carbon core vacuum furnace and pumped down to $1 \times 10^{-6}$ torr. The sample was heated to 800° C. at 2°/min for 12 hours and, with power off, furnace cooled to room temperature. The samples were removed and pressed into desired shapes for electrical and thermal measurements and re-fired with the same temperature program in vacuum. All of the $YbAl_{3-x} Mn_x$ phases of this invention crystallize in a cubic Pm3m structure.

Seebeck coefficient measurements can be performed by heating one end of the sample and establishing a thermal gradient along the length of the sample. The Seebeck voltage is measured with a Keithley 181 nanovoltmeter manufactured by Keithley Instruments, Inc. of Cleveland, Ohio 44139, at both ends, and is compared to the temperature differential at the point of measurement. The resistivity and thermal conductivity can be determined by using a PPMS system manufactured by Quantum Design of San Diego, Calif. following manufacturer's procedure. Thermoelectric materials such as n-type $YbAl_{3-x} Mn_x$ (0<x<1) can be used to manufacture thermoelectric refrigerators, heaters or generators in conjunction with p-type materials such as Bi—Sb alloys or $Bi_2Te_3$ based alloys In a thermoelectric refrigerator, the thermoelectric material is typically mounted between two plates of materials such as ceramics. One plate is located at the region to be cooled. The other plate is located where the heat is to be rejected. Current of the appropriate polarity is passed through the thermoelectric material, cooling the desired location. If the polarity of the current is reversed, the previously cooled plate will be heated and the plate rejecting the heat will be cooled. To use thermoelectric devices as generators, the thermoelectric material is again mounted between two plates. One plate is exposed to a high temperature source while the second plate is maintained at a lower temperature. Electrical power can be obtained from electrical connections across the sides of the thermoelectric material in the temperature gradient.

EXAMPLES OF THE INVENTION

Examples 1-5

The compositions $YbAl_{3-x} Mn_x$ of Examples 1-5 wherein were made using the following procedure. For each Example, appropriate amounts of the starting metals Yb, Al and Mn were weighed according to the stoichiometric ratios and mixed thoroughly in an agate mortar inside a dry box.

The gram amounts for a 4 gram sample size of the starting materials used are given in Table 1.

TABLE 1

| Ex | Composition | Ytterbium metal gms | Aluminum metal gms | Manganese metal gms |
|---|---|---|---|---|
| 1 | $YbAl_3$ | 2.7252 | 1.2748 | — |
| 2 | $YbAl_{2.99}Mn_{.01}$ | 2.7222 | 1.2692 | .0086 |
| 3 | $YbAl_{2.98}Mn_{.02}$ | 2.7192 | 1.2635 | .0173 |
| 4 | $YbAl_{2.97}Mn_{.03}$ | 2.7162 | 1.2579 | .0259 |
| 5 | $YbAl_{2.96}Mn_{.04}$ | 2.7132 | 1.2523 | .0345 |
| 6 | $YbAl_{2.95}Mn_{.05}$ | 2.7103 | 1.2467 | .0430 |
| 7 | $YbAl_{2.93}Mn_{.07}$ | 2.7044 | 1.2355 | .0601 |

In each Example, the mixed powder was pressed into a disk and fired at 800° C. for 12 hours in a vacuum furnace and cooled in vacuum to room temperature. The calcined powder was reground and pressed to 12.7 mm diameter/1-2 mm thick disks for thermal conductivity, 3 mm×3 mm bars for mounting into the PPMS for resistivity and Seebeck coefficient measurements.

X-ray powder diffraction patterns were recorded and the data showed all samples crystallized in a cubic Pm3m structure. The measured electrical and thermal properties are listed in Table 2.

TABLE 2

| Ex | Composition | Seebeck Coefficient µV/° K | Thermal Conductivity W/mK | Resistivity µOhm-cm |
|---|---|---|---|---|
| 1 | $YbAl_3$ | −86 | 12 | 100 |
| 2 | $YbAl_{2.99}Mn_{.01}$ | −90 | 6 | 175 |
| 3 | $YbAl_{2.98}Mn_{.02}$ | −92 | 5 | 170 |
| 4 | $YbAl_{2.97}Mn_{.03}$ | −90 | 4.2 | 150 |
| 5 | $YbAl_{2.96}Mn_{.04}$ | −90 | 3.1 | 130 |
| 6 | $YbAl_{2.95}Mn_{.05}$ | −90 | 3.3 | 145 |
| 7 | $YbAl_{2.93}Mn_{.07}$ | −89 | 3.0 | 220 |

The disk samples were cut and sanded to produce smooth surface. The measurement lead were attached to the sample using silver epoxy. Thermal conductivity and resistivity measurements done at room temperature in the PPMS. From Table 2, one can see a steady drop in thermal conductivity from 12 to 3 W/mK, a slight increase in resistivity from 100 to 220 µOhm-cm but nearly constant value of the Seebeck coefficient.

The figures of merit (ZT) for the undoped and Mn doped samples are shown in Table 3. The addition of 4% manganese ($YbAl_{2.96}Mn_{.04}$) increases the ZT by a factor of three over the undoped sample ($YbAl_3$), from 0.18 to 0.60.

TABLE 3

| Ex. | Composition | Figure of Merit ZT at 300 K |
|---|---|---|
| 1 | $YbAl_3$ | .18 |
| 2 | $YbAl_{2.99}Mn_{.01}$ | .23 |
| 3 | $YbAl_{2.98}Mn_{.02}$ | .30 |
| 4 | $YbAl_{2.97}Mn_{.03}$ | .39 |
| 5 | $YbAl_{2.96}Mn_{.04}$ | .60 |
| 6 | $YbAl_{2.95}Mn_{.05}$ | .51 |
| 7 | $YbAl_{2.93}Mn_{.07}$ | .36 |

What is claimed is:

1. A compound comprising:
   a) 25 atomic percent Ytterbium;
   b) between 50 and 74.999 atomic percent Aluminum; and
   c) between 0.001 and 25 atomic percent Manganese.

2. A thermoelectric refrigerator comprising a component made from the composition of claim 1.

3. A thermoelectric generator comprising a component made from the composition of claim 1.

4. A thermoelectric heater comprising a component made from the composition of claim 1.

5. A process comprising
   a) mixing powders to form a mixture with the composition
      i) 25 atomic percent Ytterbium
      ii) between 50 and 74.999 atomic percent Aluminum
      iii) between 0.001 and 25 atomic percent Manganese the composition having n-type electrical conductivity
   b) pressing said mixture to form a pressed mixture
   c) firing said pressed mixture at 800° C. for 12 hours in a vacuum furnace to form a calcined powder
   d) grinding said calcined powder to form a ground powder, and
   e) pressing said ground powder.

* * * * *